United States Patent [19]

Joccotton et al.

[11] 4,332,028

[45] May 25, 1982

[54] METHOD OF MEASURING THE MEMORY ADDRESS ACCESS TIME (AAT) UTILIZING A DATA RECIRCULATION TECHNIQUE, AND A TESTER FOR ACCOMPLISHING SAME

[75] Inventors: Jacky H. Joccotton, Saint Germain Les Corbeil; Bernard Vanoudheusden, Ballancourt, both of France

[73] Assignee: International Business Machines Corporation, Armonk, N.Y.

[21] Appl. No.: 141,716

[22] Filed: Apr. 18, 1980

[30] Foreign Application Priority Data

Jun. 29, 1979 [FR] France ............................... 79 17303

[51] Int. Cl.[3] ....................... G06F 11/22; G01R 15/12
[52] U.S. Cl. ..................................... 371/21; 324/73 R
[58] Field of Search ....................... 371/21; 324/73 R; 364/569; 365/201

[56] References Cited

U.S. PATENT DOCUMENTS 3,781,670 12/1973 McMahon, Jr. ................... 324/57 R
3,805,152 4/1974 Ebersman et al. ................ 371/21 X
4,194,245 3/1980 Pascoe et al. ........................ 364/900

OTHER PUBLICATIONS

Cavaliere et al., "Delay Measurements for High Performance Chips", *IBM Tech. Disclosure Bulletin*, vol. 20, No. 11B, Apr. 1978, pp. 4799–4801.

Squarzini, Jr., "AC Sample Testing", *IBM Tech. Disclosure Bulletin*, vol. 13, No. 5, Oct. 1970, p. 1373.

*Primary Examiner*—David H. Malzahn
*Attorney, Agent, or Firm*—Wesley DeBruin

[57] ABSTRACT

Disclosed is a method and apparatus (tester) for measuring the memory address access time (AAT) of RAM and ROS memories. The method and apparatus utilizes the data recirculation technique. The method is based on the following principle: memory (20, FIG. 9) is loaded with a predetermined data configuration, and, then, the output lines (d.O) of the memory are looped back and connected to the address lines (ad), through $\tau$-delay lines (22); it is established that the memory oscillates with frequency $$F = \frac{1}{p(\tau + AAT)}$$

deducing therefrom the AAT time which is the required address access time, factor p being a function of the loaded configuration. The tester implementing such a method is illustrated in the drawing. In a first step, the data configuration contained in block (95) is transferred to memory (20), through multiplexer (94), to the appropriate addresses (di), through multiplexer (93), under the control of counter (92) and clock (91); the read/write selection line (21) is in "write" position. In a second step, line (21) is set in "read" position. The data contained in the memory are recirculated through the delay lines (22) and multiplexer (93). The oscillation frequency F, then, is measured with a frequency meter (not shown) mounted in an output line dO.

1 Claim, 13 Drawing Figures

METHOD OF MEASURING THE MEMORY ADDRESS ACCESS TIME (AAT) UTILIZING A DATA RECIRCULATION TECHNIQUE, AND A TESTER FOR ACCOMPLISHING SAME

FIELD OF THE INVENTION

The invention relates to a method and tester for testing a memory and, more particularly, a method of measuring the memory address access time in RAM and ROS memories. The method and tester employ a data recirculation technique.

BACKGROUND OF THE INVENTION AND PRIOR ART

A.C. performance testing of integrated circuit devices by test circuits employing recirculating test loops is broadly known in the prior art. See for example: (1) IBM Technical Disclosure Bulletin Publication entitled "A.C. Sample Testing" by J. Squarzini, Jr., Vol. 13, No. 5, October 1970, page 1373; (2) U.S. Pat. No. 3,781,670 entitled "AC Performance Test For Large scale Integrated Circuit Chips" granted Dec. 25, 1973 to M. T. McMahon, Jr.; (3) IBM Technical Disclosure Bulletin Publication entitled "Delay Measurements For High Performance Chips" by J. R. Cavaliere et al., Vol. 20, No. 11B, April 1978, pages 4799–4801; and, (4) U.S. Pat. Ser. No. 883,442 entitled "System For Randomly Accessing A Recirculating Memory" filed Mar. 6, 1978 by R. A. Pascoe et al., and of common assignee herewith, granted as U.S. Pat. No. 4,194,245 on Mar. 18, 1980.

The Address Access Time (AAT) is a measurement of importance in the quality of memories because this time measures the speed at which the memory responds. In a conventional way, this time is measured as follows: Assuming that the contents of the memory under test which corresponds to address A0 is available on the data out lines; at time T=0, the address is changed and address A1 is introduced into the memory. The AAT time is the time necessary for the new data to appear on the data out lines.

It is a well-known fact that measuring the AAT time requires fast pulse shaping (rise and fall time shorter than 2 ns), a cycle time from about 5 to 100 ns, offset times between the address lines shorter than 0.1 ns, and discriminations with increments shorter than 0.1 ns. The implementation of circuits with such a performance, and more specifically of high frequency word generators (>100 MHz) leads to use costly and sophisticated testers.

SUMMARY OF THE INVENTION

Therefore, the primary object of this invention is to apply the recirculation techniques to the tests upon memories (RAM or ROS memories) in order to measure the address access time thereof.

A further object of this invention is to provide for a simple and economical recirculation-type tester adapted to be loaded manually or automatically.

Therefore, this invention concerns a method of measuring the address access time (AAT) by recirculating data between n data out lines and n address lines of a memory of the type which includes a read/write selection line, a plurality of data out lines, a plurality of data in lines, and a plurality of address lines, characterized in that it includes the following steps:

setting the selection line to "write" position,
loading the memory with a required configuration of $2n$ words of n bits, each, corresponding to the $2n$ addresses: each of the addresses is scanned and in each address (k), a word referenced: [word (k)], is written,
setting the selection line to "read" position,
connection of n address out lines to n address lines, through n $\tau$-delay lines. Since there is a maximum of $m=2n$ different words, there is an integer $p \leq m$ such that $$k = [\text{word (word}( \ldots \text{word (k)}) \ldots )]$$

as a matter of fact, p words, so that the memory oscillates with frequency F such that $$F = \frac{1}{p(\tau + AAT)}$$

AAT time is representative of a mean approximation of the AAT times which correspond to the address combinations involved in recirculation,
measuring frequency F and determining parameter p, and
determining the value of AAT time by relationship $AAT = 1/pF - \tau$.

This invention concerns also a tester for the automatic measurement of the AAT times in memories of the type which includes one read/write selection line, a plurality of data in and out lines, a plurality of address lines, characterized in that those memories include:

means for loading the memory with a required configuration contained in an auxiliary memory, so that in each address (k) a [word (k)] is written while the selection line is in "write" position,
means for connecting n data out lines of the memory to n address lines, through n $\tau$-delay lines, so that the data can recirculate between these addresses while the selection line is in "read" position, and
synchronization means for synchronizing these operations associated with means for starting and stopping load and recirculate sequences.

The foregoing and other objects, features and advantages of the invention will be apparent from the following more particular description and preferred embodiment of the invention as illustrated in the accompanying drawings.

This invention will be further disclosed, by way of an illustrative example, with reference to the accompanying drawings.

DISCLOSURE OF THE INVENTION

Figure 1:
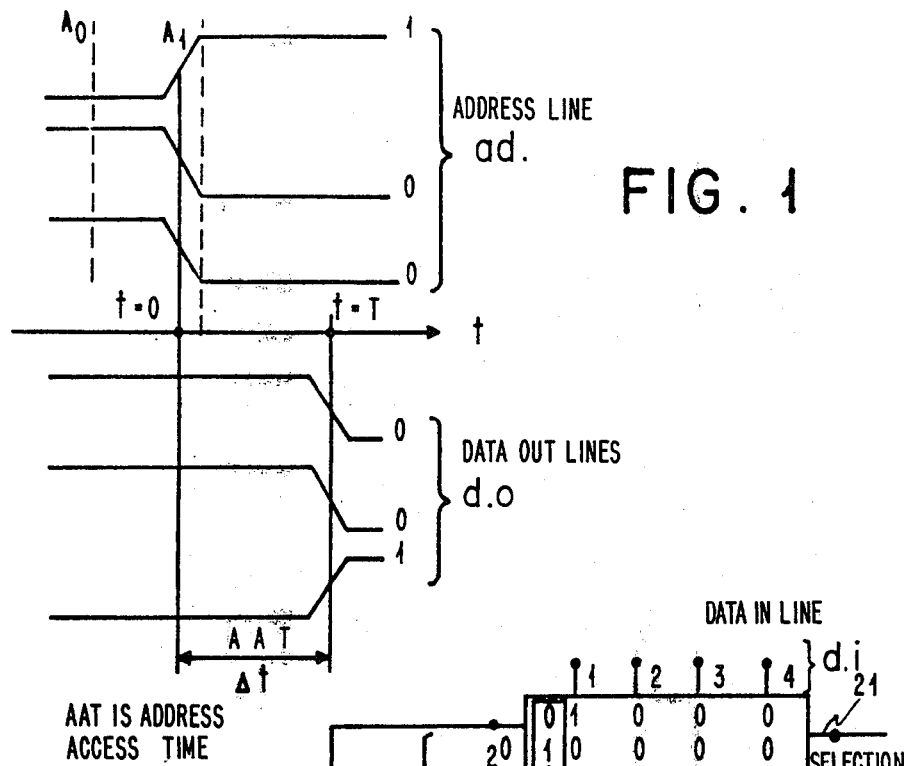
FIG. 1, is the diagram defining the Address Access Time (AAT) which is the time interval separating the time when a new address is introduced into the memory and the time when the memory contents of this address is available on the data out lines.

I. Principle of the Recirculating Technique Applied to the Measurement of the Memory AAT Time (a) Principle of the Measurement of the AAT Time between Two Addresses FIG. 1 makes the definition of the AAT time clear in a memory having three address lines (ad) and three data out lines (d.O). The contents of address $A_o$ (011) is in the memory, the word (110) is available on the data out lines. At time $t=0$, the address is changed, the new address $A_1$ (100) is introduced into the memory. The new data corresponding to this address (001) are available on the data out lines, at the end of time duration $\Delta t$. Time $\Delta t$ measures the address access times (AAT).

The AAT time is the most critical time in the memory because it sets the limits the cycle time thereof.

Figure 2:
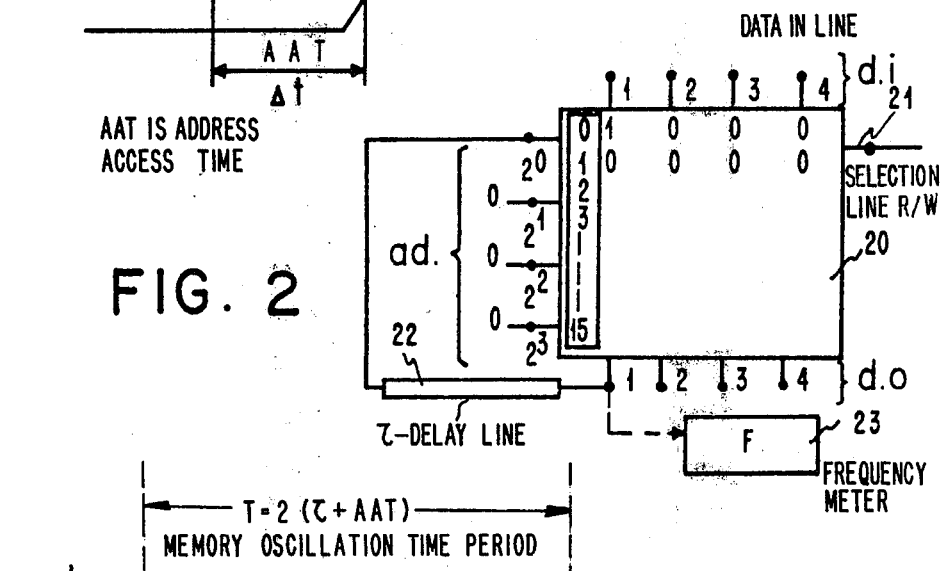
FIG. 2 illustrates a memory under test with a data recirculating loop between data out line d.O1 and address line ad $2^0$.

FIG. 2 shows schematically a conventional memory 20 provided with four address lines $2^0$ through $2^3$ (i.e., 16 different addresses from 0 to 15), and four data out lines d.O1 through d.O4; in a conventional manner, it is also provided with a selection line R/W 21 which, according to its voltage level, will set the memory in "write" mode or "read" mode. This memory has, in addition, an address decoder, not shown. When supposing that a recirculating operation is required between addresses 0 and 1, a "0" is sent on to address lines $2^1$, $2^2$ and $2^3$, a "1" is written in the bit of weight "1" (line d.i1) at address 0 and a "0" is, in the bit of weight "1" (line d.i1) at address 1, which comes to write 0001 and 0000 at addresses 0 and 1, by means of data in lines d.i1 through d.i4. Then, data out line d.O1 is connected to address line ad $2^0$, through a $\tau$-delay line 22.

When assuming that the memory is at address 1, word (0000) will appear at the output, i.e., "0" will be on data out line d.O1.

At time $t=\tau$, the address will be "0" on line $2^0$. When an address is displayed in a memory, time AAT is necessary for it to give the corresponding word (1000), therefore at time $t=AAT+\tau$, the word (1000) appears at the output, and the iteration is as follows:

|  | Signal on address line $2^0$ | Signal on data line d.O1 |
| --- | --- | --- |
| t = 0 | 1 | 0 |
| t = $\tau$ | 0 | 0 |
| t = $\tau$+AAT | 0 | 1 |
| t = ($\tau$+AAT) + $\tau$ | 1 | 1 |
| t = ($\tau$+AAT) + ($\tau$+AAT) | 1 | 0 |
| t = 2 ($\tau$+AAT) + $\tau$ | 0 | 0 |
| t = 2 ($\tau$+AAT) + $\tau$+AAT | 0 | 1 |
| t = 3 ($\tau$+AAT) + $\tau$ | 1 | 1 |

This iteration can be presented differently. The reasoning can be in terms of addresses and words appearing on the data out lines, remembering that in address k, word [word (k)] has been written

| Delay | Address | words (output d.O) |
| --- | --- | --- |
| t=0 | 0001 | word (0001) = 0000 |
| t=$\tau$+AAT | (word (0001)) = 0000 | word (word (0001)) = 0001 |
| t=2($\tau$+AAT) | word (word (0001)) = 0001 | word (word (word (0001))) = 0000 |

According to these iterations, it can be observed that the memory oscillates with a timer period $T=2(\tau+AAT)$. Such a period appears also in FIG. 3 which illustrates the signals appearing on lines d.O1 and ad $2^0$;

Factor $\tau$ depends on delay line 22 which is a passive component, which means that this time is perfectly well determined and unchangeable. This is a feature proper to the tester.

The measurement of $F=1/T$ with a frequency meter 23 or by means of any other techniques, makes it possible to know the AAT time for this address line.

As a matter of fact, the AAT time which is measured is an approximation of the different AAT times for each address since there are measured successively the time interval $\Delta t$ which corresponds to the time length necessary for the data to be sent out when passing from address 0 to address 1, and then the time interval $\Delta t$ which corresponds to the time length necessary for the data to be sent out when passing from address 1 to address 0. Indeed, $\Delta t_1 \neq \Delta t_2$ and one can reasonably write;

$\Delta t_1 = \Delta t_2 = AAT$, in the wider sense.

(b) Principle of the Measurement of the Mean AAT Time Between Several Addresses

It may be of interest to cause the memory to oscillate between more than two addresses, which gives the facility of averaging several AAT times and indicating more precisely the speed of the memory. Such an approach may be also useful in the case of critical configurations, such as, for instance, when there are several address lines to be switched simultaneously.

It is assumed that a recirculating operation is needed between n data out lines and n address lines (which corresponds to $2^n$ addresses).

The read/write selection line is set in "write" position.

An n-bit word is loaded in each of the $m=2^n$ addresses; in other words, each of the addresses is scanned and a word [word (k)] is written in each address k ($0 < k < 2^{n-1}$).

Figure 4:
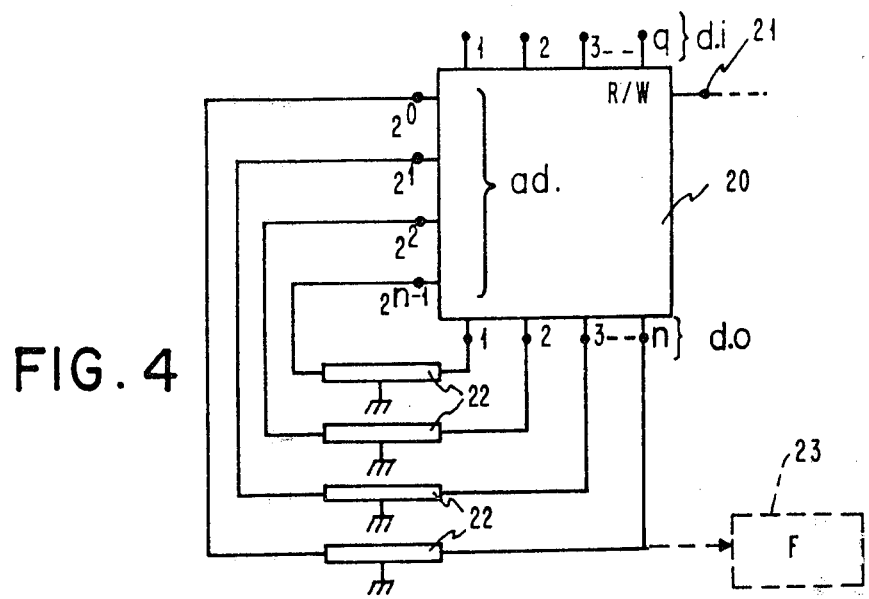
FIG. 4 illustrates a memory under test, identical with the memory shown in FIG. 2, when four data recirculating loops are established.

The n output lines are looped upon the n address lines, through n delay lines 22 (with a unit delay $\tau$), as schematically shown in FIG. 4. Memory 20 is set in "read" mode, through the R/W selection line 21.

It is supposed that address (1) is decoded in the memory; at time t=0, word [word (1)] will appear at the output; at time t=$\tau$, the address will be [word (1)], but time $\Delta t$=AAT is needed between the time when this address is displayed and the time when the word corresponding to this address is available on the data out lines:

Therefore,

| | |
|---|---|
| at time t = ($\tau$+AAT) | the data out will be [word (word (1))] |
| at time t = ($\tau$+AAT) + $\tau$ | the address will be [word (word (1))] |
| at time t = 2 ($\tau$+AAT) | the data out will be [word (word (word (1)))] |
| . | |
| at time t = j ($\tau$+AAT) | the data out will be [word (... (word (1)) ...)] | as a matter of fact, (j+1) words. Since there are, at most, only $m=2^n$ words that are different, there is integer $p \leq m$ such that at the end of p scanned addresses, the cycles starts again, i.e., the following relationship can be written $$k = \frac{[word\ (\ldots(word\ (k))\ldots)]}{p\ words}$$

In other words, the word available on the output lines corresponds, indeed, to an address already handled, which ensures recirculation. With the above reasoning in terms of addresses and words, there is obtained, with p words, the following correspondence:

consideration during the various address combinations. A more detailed explanation will be given further on in reference to FIG. 13.

This factor p is such that $2 \leq p \leq 2^n$ depends on the words memorized, whereas, as seen above, $\tau$ is a constant. The measurement of the frequency can be made with a frequency meter 23.

(c) Illustration

These theoretical considerations correspond to various possible operations and will be made clearer hereinafter with the help of a RAM memory including eight words having three bits each, i.e., a memory provided with three address lines and three data out lines.

The contents of the memory is illustrated in Table I. For each of the addresses, the three-bit word has been directly replaced by the address corresponding thereto. Address 0, for instance, corresponds to 000, and should the contents of the word at address 4 be 000, the contents 0 will be written.

TABLE I

| address | 0 | 1 | 2 | 3 | 4 | 5 | 6 | 7 |
|---|---|---|---|---|---|---|---|---|
| contents | 1 | 2 | 3 | 4 | 0 | 5 | 7 | 6 |

Figure 5:
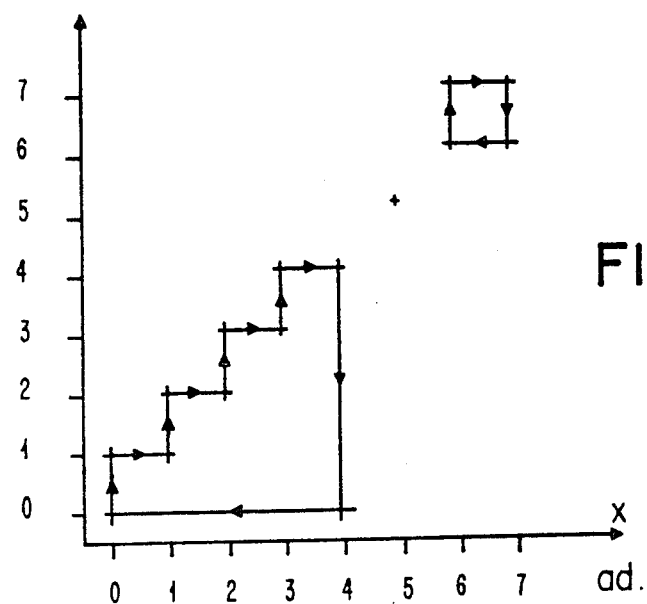
FIG. 5 is a diagram of the different possible recirculating cases either between more than two addresses, or between two addresses, or when the system is steady.

The diagram illustrated in FIG. 5 is obtained from this table. The X-axis is representative of the addresses (numbered from 0 to 7) and the Y-axis is representative of the memory contents in the corresponding address which, after delay $\tau$, will be applied to the address decoder in order to supply the new address.

Assuming that the first decoded address is 0; for this address, the contents of the memory is 1. After time $\tau$+AAT, 1 will be the new decoded address. Number 2 contained at address 1 will be transferred to the decoder after time $\tau$+AAT, and so on. The sequence is illustrated in FIG. 5, and is going on until address 0 is retrieved again (here, address 4); the memory will then oscillate according to the access cycle 0-1-2-3-4-0 ... etc.

The same will hold true when the first decoded address is one of addresses 1, 2, 3 or 4.

| Delay | Address | Words (output d.O) | |
|---|---|---|---|
| t=0 | k | [word (k)] | |
| t=$\tau$+AAT | [word (k)] | [word (word (k))] | |
| . | | | p times |
| . | | | |
| t=(p−1) ($\tau$+AAT) | $\frac{[word\ (\ldots(word\ (k))\ldots)]}{(p-1)\ words}$ | $\frac{[word\ (\ldots(word\ (k))\ldots)]}{p\ words}$ | |
| t=p($\tau$+ATT) | K | | | because, by hypothesis
$$k = \frac{[word\ (\ldots(word\ (k))\ldots)]}{p\ words}$$

It results therefrom that the memory will oscillate at frequency $$F = \frac{1}{p(\tau + AAT)}$$

Figure 3:
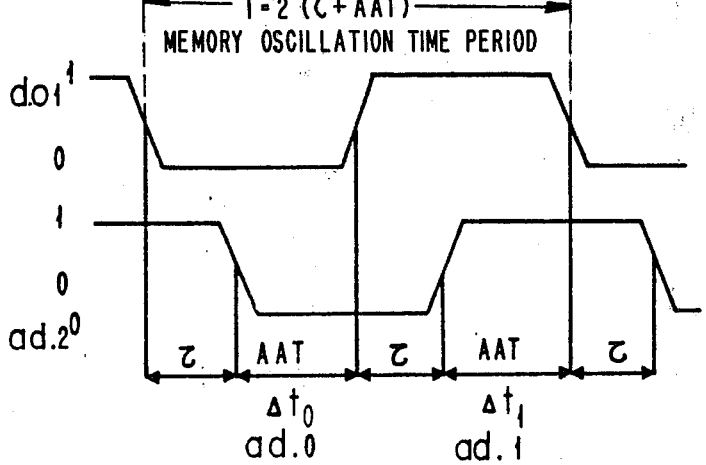
FIG. 3 is a diagram of the time-shifted oscillation signals on data line d.O1 and address line ad $2^0$, when a recirculating loop is established.

In the preceding case, FIG. 3 shows that p=2. Generally, this factor p is easily determined by the loaded sequence.

From the foregoing, the AAT such as measured here corresponds to the mean various AAT times taken into On the other hand, when the first decoded address is 5, the corresponding contents is 5 and, after time $\tau$+AAT, 5 will be the new decoded address. The memory will remain at this address, the system will be steady (see FIG. 5).

It will now be supposed that the first decoded address is 6; the output data corresponding to this address is 7; this 7 is transferred after time $\tau$+AAT as the new address. Contents 6 corresponds to this address. In the latter case, as shown in FIG. 5, the memory oscillates between addresses 6 and 7.

Thus, the two operating principles studied under paragraphs Ia and Ib, are verified, and there are three possible operating modes:
  recirculation between two addresses,
  recirculation over one cycle having several addresses,
  system steady.
the operating mode being only dependent on the address chosen to initialize the operation and on the contents (chosen, as a rule) of the memory.

Erratic pulses (noise) might undesirably cause the change from one operating mode to another one. It is, therefore, desirable to choose a data configuration which complies with only one possible mode. When data recirculation is between two addresses, only, addresses 0 and 2, for instance, data shown in Table II will be chosen.

TABLE II

| address  | 0 | 1 | 2 | 3 | 4 | 5 | 6 | 7 |
|----------|---|---|---|---|---|---|---|---|
| contents | 2 | 0 | 0 | 0 | 0 | 0 | 0 | 0 |

The only possible operating mode is between addresses 2 and 0. All the other addresses transfer to 0, thereby ensuring cycle 2⟵⟶0.

II. Preferred Embodiment

As seen above, the loading of the memory, and then, the looping of the data out lines on the address lines are the two main points of this invention.

This can be achieved in two ways:

(a) Manual Loading

Figure 6:
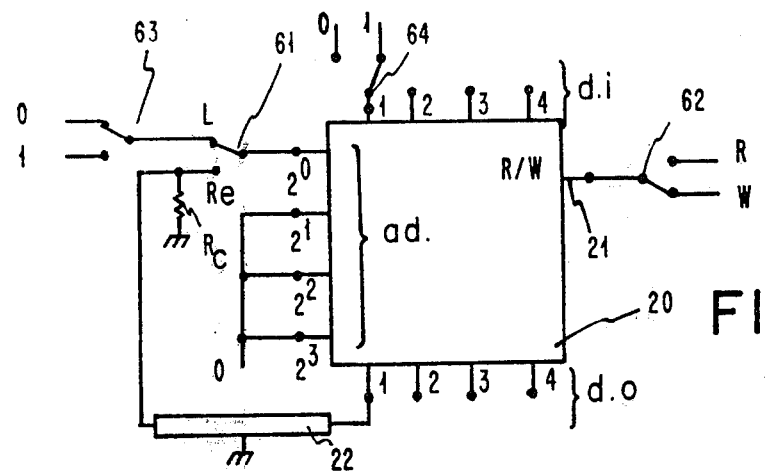
FIG. 6 is the preferred embodiment of the test carried out upon the memory of FIG. 2, wherein the loading and recirculating steps are entirely manual.

The circuit is shown in FIG. 6. The memory is loaded by means of several switches which are manually operated. Loading: Switch 61 is in position L (load); switch 62 which controls the level of the read/write selection line 21 is in position W (write); switch 63 is in "address 0" position; and switch 64 is in "write 1" position. FIG. 6 illustrates those switch positions. Number "1", thus, is placed at address 0. Then, when bringing switch 63 to position 1, and switch 64 to position 0, a "0" is introduced into address 1.

Recirculating: switch 62 is brought to position R (reading) and switch 61 is brought to position Re (recirculating).

Therefore, the memory oscillates between addresses 0 and 1 and its oscillation frequency can be measured by means of a frequency meter (not shown) and one can deduce therefrom the AAT time. Delay line 22 is looped on the characteristic impedance Rc of the line. The value of Rc is imposed by the specifications of the memory under test. The delay line is $\tau$-delayed, which delay is specified by the manufacturer and is a function of the length of the line. This system has the advantages of being economical and simple; however, it is slow in operation (30 seconds are necessary to load the memory), and requires the operator to be constantly present.

(b) Automatic Loading

Figure 7:
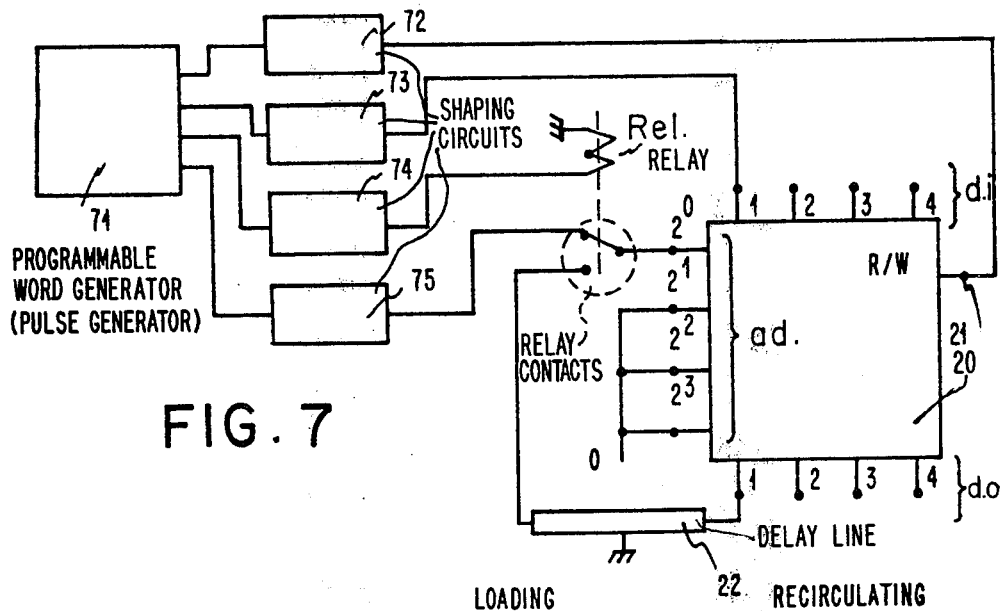
FIG. 7 is another preferred embodiment of the test carried out upon the memory of FIG. 2, wherein the loading and recirculating steps are entirely automatic.
Figure 8:
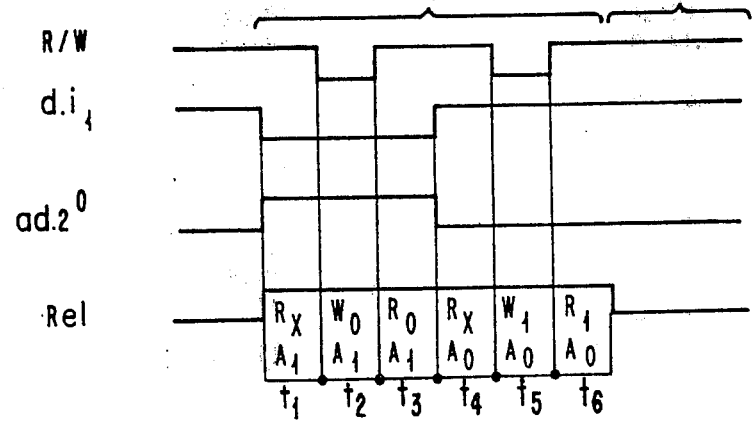
FIG. 8 is a diagram of the voltage levels corresponding to the read/write selection line (R/W), the data in line d.i1, the address line ad $2^0$, and to the relay when the preceding test is effected.
Figure 9:
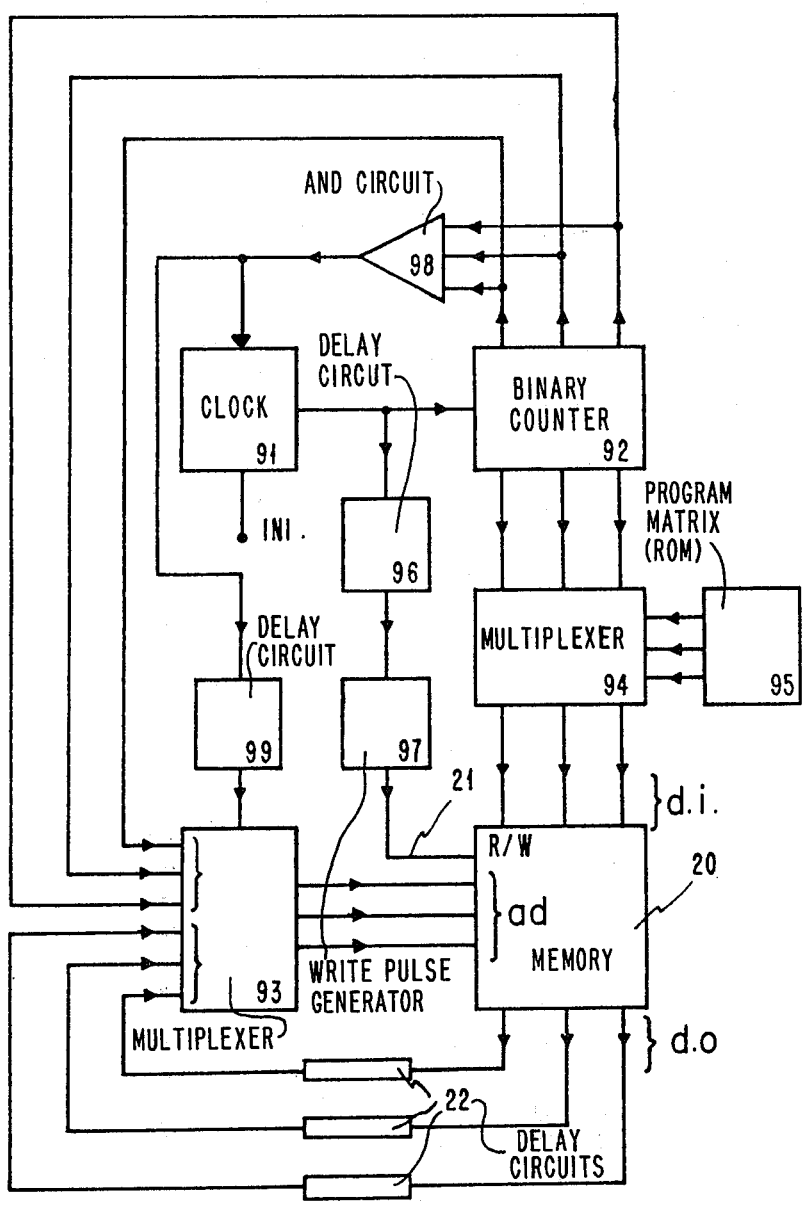
FIG. 9 is a schematic diagram of a circuit of special use for the automatic test upon the memory shown in FIG. 2.

A first implementation is illustrated in FIG. 7. This system is comprised of a programmable word generator 71 which operates as a pulse generator, and four shaping circuits 72 and 75. Circuit 74 controls relay Rel which is used to connect the address line ad $2^0$ to the delay line during the "read" operation. Selection switch R/W 62 and data in switch 64 (FIG. 6) are no more necessary. One operating cycle controlled by generator 71, is shown in FIG. 8. This figure illustrates the voltage levels of the different lines, namely, the read/write selection line, the data in line d.i1, the address line ad $2^0$, and the position of relay Rel. Relay is at level 1 (energized) during the loading step (this position is shown in FIG. 7). During this step, "0" is written in address 1 during time t2; the "0" is read out during time t3: then, a "1" is written in address 0 during time t5, this operation being checked during time t6. Then, relay is brought to level 0, and the data are caused to recirculate. In a second implementation, a specific circuit is utilized to ensure both loading and recirculating for the measurements of the AAT time in a memory. The entire system is illustrated in FIG. 9. When the test is based on the recirculating technique, the sequence is loaded in the memory, by means of a specific circuit which, therefore, conventionally plays the part of a word generator, though simple and less fast (clock frequency 1 MHz and calibration of the signals with a precision lower than 50 ns), since, as seen above, the AAT time is essentially a function of the delay on the delay line. In addition, the specific circuit, which is a standard TTL logic circuit, can entirely be placed on a single board, which reduces considerably the cost of the tester. Loading: In a first step, the address are scanned while being, each, loaded with its contents. Clock 91 increments a binary counter 92. The signals issued from this counter 92 increment multiplexer 93 which pilots the address circuits of the memory 20 under test, on the one hand, and simultaneously, are utilized to control the multiplexer 94 scanning the contents of the program matrix 95 (its contents being the information to be written in the memory), on the other hand. Such a matrix can be a ROM or REPROM memory, or a simple control panel provided with switches. Delay circuit 96 is utilized to compensate for the delays caused by counters 92 and multiplexers 93 and 94 (in order to be sure that the addresses and the data reach the memory in synchronism), and to apply the write potential upon R/W line 21, during the appropriate time. The write pulse generating circuit 97 is utilized to set the memory into "write" position under the control of circuit 96. When all the addresses have been scanned, AND circuit 98 detects the last address (111, for instance), that is applied to the memory, and blocks the clock pulses, and, then, after a delay in circuit 99, activates multiplexer 93 so as to loop the memory outputs on the corresponding addresses for a next recirculating operation thereof. Such circuit makes it possible to automate the measurement. It suffices to send a pulse (either manual or remote) to the clock resetting circuit to start the recirculation. For a significant test, it is of importance that the data introduced into the memory are not subject to undesired modifications in the course of time. In other words, the contents of the memory cells should be steady; hence, use of low-noise programmable power supplies, control of the temperatures, and control of the cells non concerned with the test but, nevertheless, being possibly loaded. The frequency measurements are made with a digital computer the frequency being simply deduced from the n number of pulses counted during time interval $\tau$. In the results given hereafter, the delay on the utilized delay line is 4.7 nanoseconds for memories having mean AAT times in the order of 5 nanoseconds. The corresponding frequency is $$F = \frac{1}{2(AAT + \tau)} = 50 \text{ MHz}$$

III. Results

Figure 10:
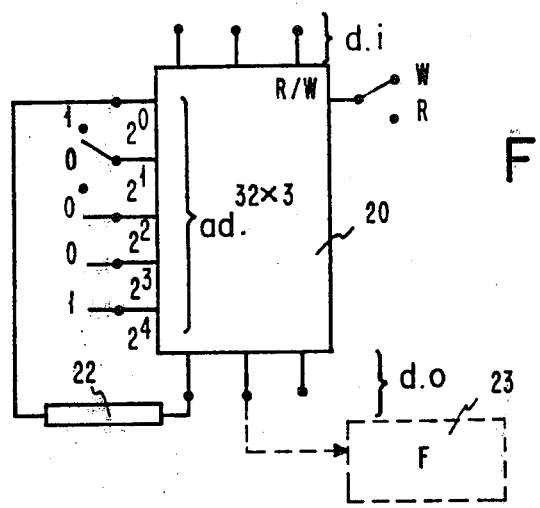
FIG. 10 is a schematic diagram of a 32×3 memory under test the results of which will be given in the following description.

An experimental arrangement such as shown in FIG. 10 and very similar to the one shown in FIG. 2, has been made to test a 32×3 (32 words of 3 bits, each) memory. Data recirculation is accomplished between two consecutive address lines in two different positions of the memory, such as, for instance, between addresses 16 and 17, on the one hand, and 18 and 19, on the other hand. In the first case, 17 (10000) has been loaded to address 16 (01111), and 16 (01111) has been loaded to address 17 (10000). A similar loading has been operated for addresses 18 and 19, namely, 19 has been loaded to address 18 and 18 has been loaded to address 19. As to the other address lines, a "1" is applied to address line $2^4$ and a "0" is, to the address lines $2^3$ and $2^2$. A 4.7 ns delay line ensures relooping on the address line ad $2^0$.

A switch has been mounted in address line ad $2^1$, which is used to apply binary values "0" and "1". When the switch is in position 1, recirculating is operated between addresses 18 and 19, and when it is in position 0, recirculating is operated between addresses 16 and 17. A frequency meter is mounted in line d.O2 in order not to disturb the measurements. There will now be measured the sum of the address access times corresponding to addresses 16 and 17, and to addresses 18 and 19, as well.

The results have been compared with the times measured by a conventional type high performance tester on a 100-memory sample.

$$Fr = \frac{1}{2(AAT + \tau)} \text{ hence } AAT = \frac{1}{2F} - \tau$$

Figure 12:
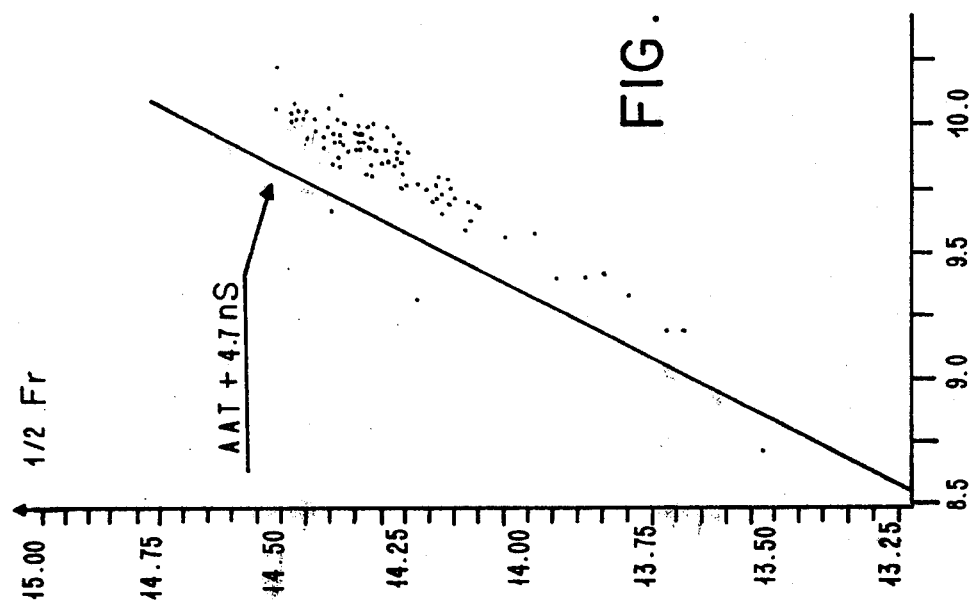
FIGS. 11 and 12 respectively illustrate the curves for determining the AAT time for a 32×3 memory sample for recirculating data between two successive addresses.
Figure 11:
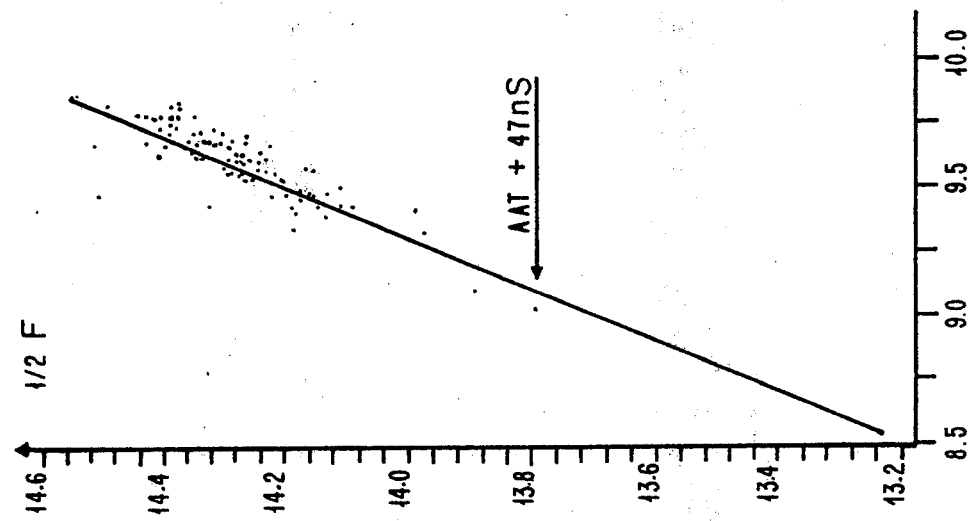

The AAT times measured by the conventional tester have been correlated with $\frac{1}{2}F$. The results are shown in FIG. 11 for recirculating data between addresses 16 and 17, and in FIG. 12, for recirculating data between addresses 18 and 19. These results show off the following elements:

(addresses 16, 17)—The correlation factor between AAT and $\frac{1}{2}F$ is 0.92.

The value of the mean difference: $\frac{1}{2}F$—AAT is 4.7 seconds; this is the delay on the delay line, and the standard residual deviation is 95 picoseconds.

For addresses (18, 19), the correlation factor between AAT and $\frac{1}{2}F$ is 0.92. The value of the mean difference: $\frac{1}{2}F$-AAT is 4.5 nanoseconds. The standard residual deviation is 95 picoseconds.

With this recirculating technique, it is possible to measure address access times with a precision equal to, or better than, that obtained with the highest performance standard apparatus known to this day.

Finally, the AAT times resulting from the different address combinations have been compared. The AAT times have been measured for a recirculating operation between two addresses, from address A ($0 \leq A \leq 7$) to address B ($0 \leq B \leq 7$) for each address couple A. B ($A \neq B$), which corresponds to 28 address couples.

Figure 13:
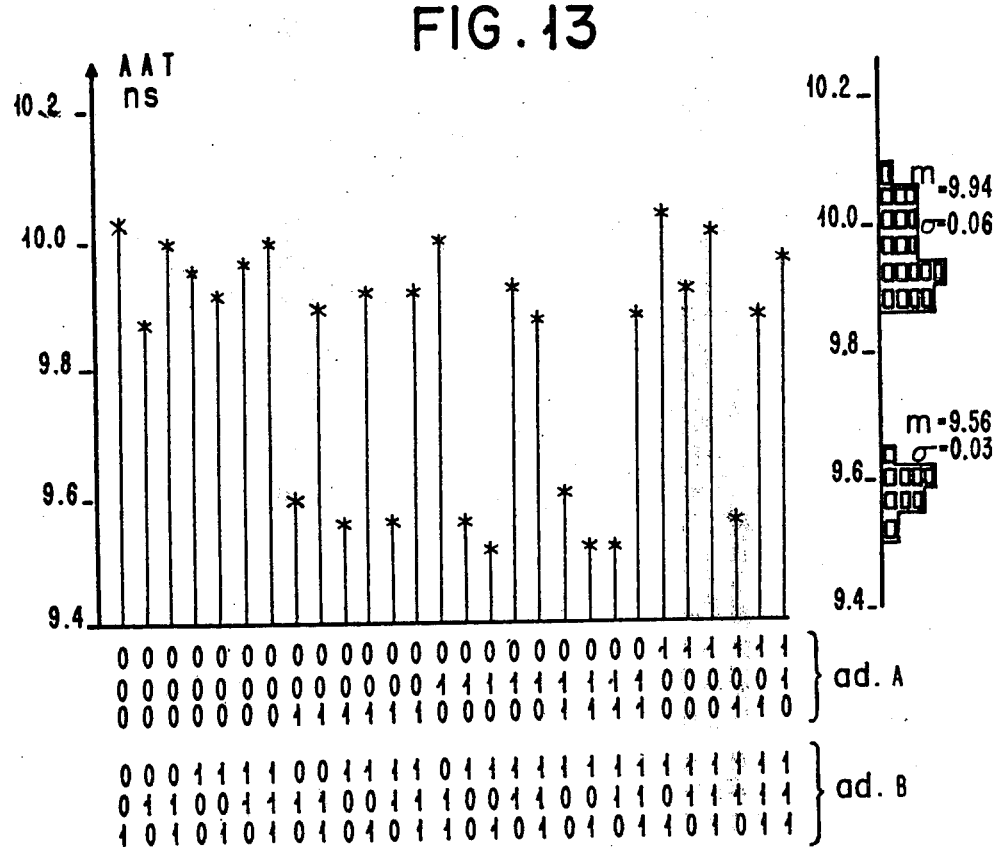
FIG. 13 illustrates schematically the AAT times measured for all the combinations of two distinct addresses in a 32×3 memory.

From FIG. 13, it can be seen that, for each address couple (A,B) in the X-axis, the sum of the AAT times corresponding to this couple, i.e., $(AAT_{(A \leftarrow B)} + AAT_{(B \rightarrow A)})$ is represented on the Y-axis. It can be appreciated that, when addresses A and B have at least two address bits in opposite way, the AAT time is about 400 picoseconds to 500 picoseconds faster; for instance, for couple adA=010 and adB=101, the corresponding AAT time is about 9.5 nanoseconds. The figure illustrates the typical averages and deviations.

IV. Industrial Application

The test based on the recirculation technique makes it possible to AC test (alternating current) RAM and ROS memories in regard to their AAT times. This test is effected with high precision in the measurement and is very economical because the circuitry is simple and is not based on high performance (as far as the frequencies are concerned). In addition, such a technique is independent of the speed of the memory to be tested. The obtained results show that the frequency measurements can be made easily with $10^{-4}$ discriminations, i.e., over a 30 ns time period, the discrimination obtained is 3 ps. The discrimination will be all the better as the memory is faster.

Such a technique, however, is limited in the choice of the test configurations in order to avoid the noise pulses, as seen above, and is also limited in the test upon the ROS memories the contents of which should be determined beforehand.

It is clear that the preceding description has only been given as an unrestrictive example and that numerous alternatives can be envisaged without departing from the spirit and scope of this invention.

While the invention has been particularly shown and described with reference to the preferred embodiments thereof, it will be understood by those skilled in the art that the foregoing and other changes and details may be made therein without departing from the spirit and scope of the invention.

We claim:

1. A tester (FIG. 9) for the automatic measurement of the Address Access Time (AAT) of a read/write memory (20), said memory having a plurality of data in lines (d.i.), a plurality of data out lines (d.o.), a plurality of address lines (ad) and read/write control means (21), said tester including:

first multiplexer circuit means (94) having an output connected to said data in lines (d.i.) of said memory (20), said first multiplexer circuit means having first and second inputs;

program matrix circuit means (95) having an output connected to said first input of said first multiplexer circuit means (94), said program matrix means storing data to be written into said memory (20);

second multiplexer circuit means (93) having an output connected to said plurality of address lines (ad) of said memory (20), said second multiplexer circuit means having first, second and third inputs;

first delay circuit means (22) connecting said plurality of data out lines (d.o.) of said memory (20) to said first input of said second multiplexer circuit means (93);

logical circuit means (98) having an input and an output, said logical circuit means consisting essentially of AND circuit means;

binary counter circuit means (92) having an input and an output, said output of said binary counter circuit means being connected in common to said second input of said first multiplexer circuit means (94), said input of said logical circuit means (98) and said second input of said second multiplexer circuit means (93);

second delay circuit means (99) having an input and an output, said output of said second delay circuit means being connected to said third input of said second multiplexer circuit means (93), said input of said second delay circuit means (99) being connected to said output of said logical circuit means (98);

third delay circuit means (96) having an input and an output;

clock circuit means (91) having an input and an output, said input of said clock circuit means being connected to said output of said logical circuit means and said output of said clock circuit means being connected in common to said input of said binary counter circuit means (92) and said input of said third delay circuit means (96);

and, pulse generator circuit means (97) having an input connected to the output of said third delay circuit means (96) and an output connected to said read/write control means (21) of said memory (20).

* * * * *